United States Patent
Lee et al.

(10) Patent No.: US 11,011,617 B2
(45) Date of Patent: May 18, 2021

(54) FORMATION OF A PARTIAL AIR-GAP SPACER

(71) Applicant: INTERNATIONAL BUSINESS MACHINES CORPORATION, Armonk, NY (US)

(72) Inventors: Choonghyun Lee, Rensselaer, NY (US); Kangguo Cheng, Schenectady, NY (US); Heng Wu, Guilderland, NY (US); Peng Xu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 428 days.

(21) Appl. No.: 15/934,210

(22) Filed: Mar. 23, 2018

(65) Prior Publication Data
US 2019/0296123 A1 Sep. 26, 2019

(51) Int. Cl.
H01L 29/66 (2006.01)
H01L 29/51 (2006.01)
H01L 21/764 (2006.01)
H01L 29/06 (2006.01)
H01L 21/02 (2006.01)

(52) U.S. Cl.
CPC .... H01L 29/6656 (2013.01); H01L 21/02167 (2013.01); H01L 21/02175 (2013.01); H01L 21/02247 (2013.01); H01L 21/764 (2013.01); H01L 29/0649 (2013.01); H01L 29/512 (2013.01)

(58) Field of Classification Search
CPC .............. H01L 29/6656; H01L 21/764; H01L 29/0649
See application file for complete search history.

(56) References Cited

U.S. PATENT DOCUMENTS

| 9,252,233 | B2* | 2/2016 | Hsiao ............. H01L 29/4991 |
| 9,362,355 | B1 | 6/2016 | Cheng et al. |
| 9,608,065 | B1 | 3/2017 | Bergendahl et al. |
| 9,716,158 | B1 | 7/2017 | Cheng et al. |
| 9,721,897 | B1 | 8/2017 | Cheng et al. |
| 9,786,760 | B1* | 10/2017 | Bonilla ............. H01L 29/7827 |
| 10,115,804 | B2* | 10/2018 | Wang ............... H01L 29/7843 |
| 2002/0158337 | A1* | 10/2002 | Babich ............. H01L 21/76835 257/758 |
| 2011/0291281 | A1 | 12/2011 | Huang et al. |

OTHER PUBLICATIONS

Cheng et al., "Air Spacer for 10nm FinFET CMOS and Beyond," 2016 IEEE International Electron Devices Meeting Dec. 3-7, 2016. pp. 1-4.

* cited by examiner

*Primary Examiner* — Mark W Tornow
*Assistant Examiner* — Abbigale A Boyle
(74) *Attorney, Agent, or Firm* — Tutunjian & Bitetto, P.C.; Randall Bluestone

(57) ABSTRACT

A method is presented for reducing parasitic capacitance. The method includes forming multi-layer spacers between source/drain regions, forming a dielectric liner over the multi-layer spacers and the source/drain regions, forming gate structures adjacent the multi-layer spacers, forming a self-aligned contact cap over the gate structures, and removing a sacrificial layer of each of the multi-layer spacers to form air-gaps between the gate structures and the source/drain regions.

15 Claims, 7 Drawing Sheets

FORMATION OF A PARTIAL AIR-GAP SPACER

BACKGROUND

Technical Field

The present invention relates generally to semiconductor devices, and more specifically, to forming a partial air-gap spacer to reduce parasitic capacitance within semiconductor structures.

Description of the Related Art

In the current fabrication of an integrated circuit, a dielectric layer is formed as a device isolation structure to cover a substrate and a transistor after completion of the manufacturing of the transistor. A consequence of having multiple layers of conductive structure separated by a dielectric material, however, is the formation of a parasitic capacitor between a transistor gate and a source/drain region. The parasitic capacitance between the conductive material separated by the insulating material in microelectronic devices contributes to effects such as the resistor-capacitor (RC) delay time and a decrease of the device operating speed.

SUMMARY

In accordance with an embodiment, a method is provided for reducing parasitic capacitance. The method includes forming a three-layer spacer in direct contact with sidewalls of a sacrificial layer, forming a source/drain region within a substrate, forming a dielectric liner over the sacrificial layer and the source/drain region, forming an inter-layer dielectric (ILD) over the source/drain region, replacing the sacrificial layer with a gate structure, replacing the ILD with a conducting material, and removing a middle layer of the three-layer spacer to form air-gaps between the gate structure and the source/drain region.

In accordance with another embodiment, a method is provided for reducing parasitic capacitance. The method includes forming multi-layer spacers between source/drain regions, forming a dielectric liner over the multi-layer spacers and the source/drain regions, forming gate structures adjacent the multi-layer spacers, forming a self-aligned contact cap over the gate structures, and removing a sacrificial layer of each of the multi-layer spacers to form air-gaps between the gate structures and the source/drain regions.

In accordance with yet another embodiment, a semiconductor structure is presented for reducing parasitic capacitance. The semiconductor structure includes multi-layer spacers formed between source/drain regions, gate structures formed adjacent the multi-layer spacers, a cap layer formed over the gate structures, and air-gaps formed between the gate structures and the source/drain regions, the air-gaps defined within the multi-layer spacers.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
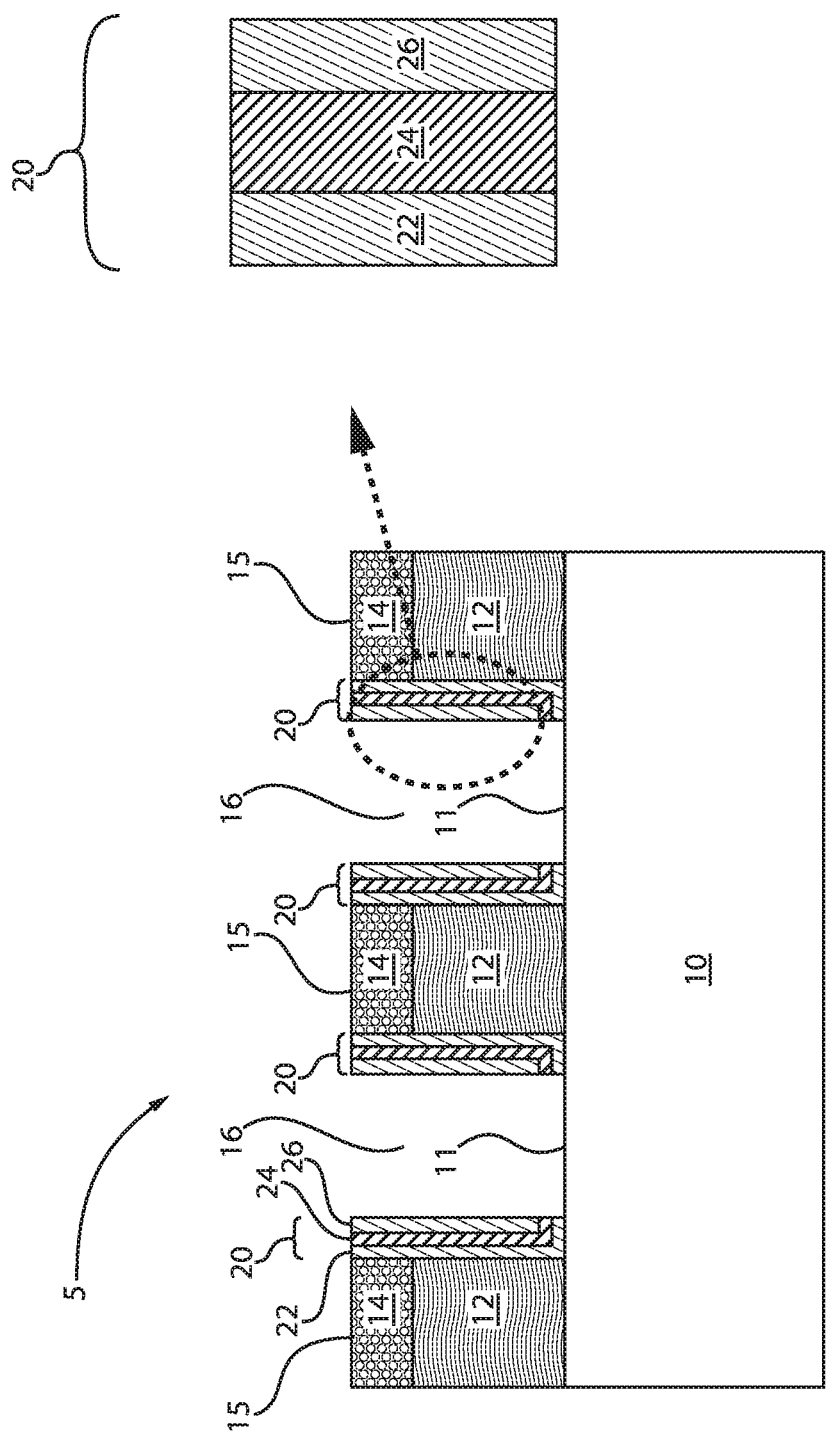
FIG. 1 is a cross-sectional view of a semiconductor structure including triple-layer spacers formed in direct contact with sacrificial layers, in accordance with an embodiment of the present invention.

Embodiments in accordance with the present invention provide methods and devices for reducing parasitic capacitance between, e.g., gate structures and source/drain regions. In electrical circuits, parasitic capacitance is unwanted capacitance that exists between parts of an electronic component or circuit simply because of their proximity to each other. When two electrical conductors at different voltages are close together, the electric field between them causes electric charge to be stored thereon, which is referred to as parasitic capacitance. Therefore, reducing back-end-of-line (BEOL) interconnect parasitic capacitance remains a focus for advanced technology node development. The exemplary embodiments provide for air-gaps that can be created and incorporated into semiconductor manufacturing technology to reduce parasitic capacitance.

Embodiments in accordance with the present invention provide methods and devices for forming partial air-gap spacers. The air-gap spacers can be multi-layer spacers. In one example, the multi-layer spacers can be, e.g., three-layer spacers. The middle layer of the three-layer spacers can be formed from a sacrificial material. Removal of such sacrificial material during the semiconductor fabrication process results in the formation of the partial air-gap spacers. Such air-gap spacers can meet device performance targets for various gate stack parameters because the work function metal (WFM) and the high-k (HK) layers are not exposed to plasma damage during spacer and self-aligned cap removal processes. Thus, air-gap spacers can be formed without any gate damage.

Embodiments in accordance with the present invention provide methods and devices for forming partial air-gap spacers having, e.g., a germanium dioxide ($GeO_2$) sacrificial layer, which can resolve the WFM/HK exposure to plasma damage during self-aligned contact cap and silicon nitride (SiN) spacer removal. The air-gap spacers can be trilayer spacers. In one example, the trilayer spacers can be formed by silicon boron carbon nitride/germanium dioxide/silicon boron carbon nitride (SiBCN/$GeO_2$/SiBCN). Each of the layers can have a thickness of about 2 nm and all the spacers can be deposited by, e.g., an atomic layer deposition (ALD) process. The 2 nm SiBCN/2 nm $GeO_2$/2 nm SiBCN configuration can produce a spacer having a total thickness or width of 6 nm, which is compatible with 7 nm node process technology. By removing the 2 nm $GeO_2$ sacrificial layer, or the middle layer of the trilayer spacer, the air-gap therebetween can produce more than about 50% capacitance reduction as the total capacitance can be dominated by air-gap.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure including triple-layer spacers formed in direct contact with sacrificial layers, in accordance with an embodiment of the present invention.

Figure 5:
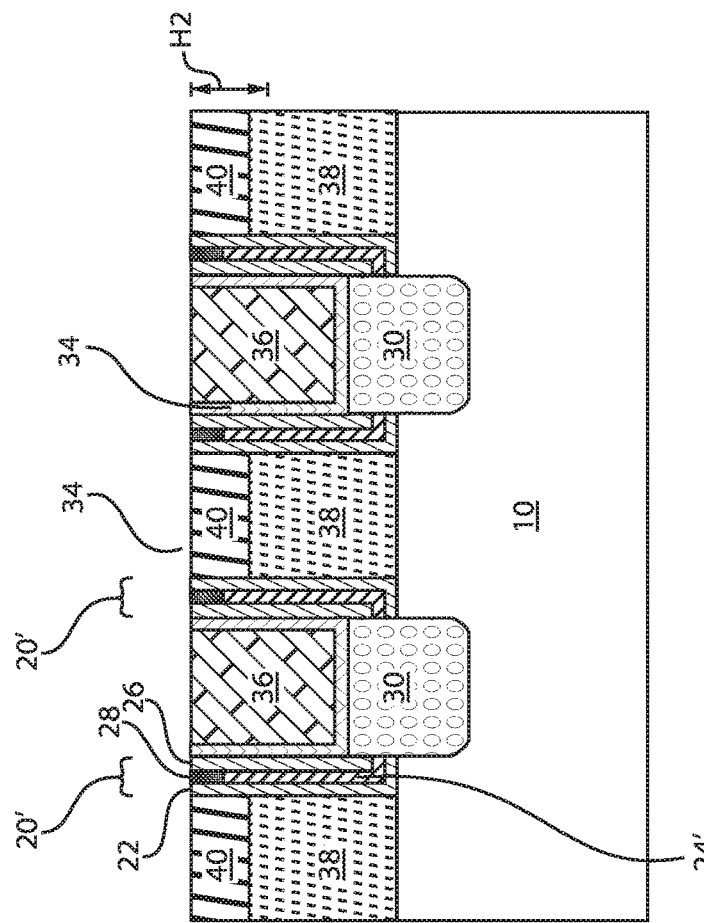
FIG. 5 is a cross-sectional view of the semiconductor structure of FIG. 4 where the sacrificial layers are removed and replaced with a gate structure and a self-aligned contact cap, in accordance with an embodiment of the present invention.

A semiconductor structure 5 includes a fin 10 over which sacrificial regions or layers 12 or sacrificial gate structures 12 are formed. The sacrificial gate structure 12 is a structure that is employed in the process sequence for forming the final device structure, but the sacrificial gate structure 12 is removed prior to finalizing the device structure. In some embodiments, the sacrificial gate structure 12 provides the geometry for a later formed functional gate structure 38 (FIG. 5). The functional gate structure 38, which remains in the structure of the final device controls device switching, i.e., the electrical state of a device, e.g., fin field effect transistor (FinFET), from "ON" to "OFF."

The sacrificial gate structure 12 can be formed from, e.g., amorphous silicon. In another example embodiment, the sacrificial gate structure 12 can include a semiconductor material such as polysilicon or a silicon-containing semiconductor alloy such as a silicon-germanium alloy. The sacrificial gate structure 12 can be formed using chemical vapor deposition (CVD) or plasma enhanced chemical vapor deposition (PECVD). The sacrificial gate structure 12 can have a thickness from about 20 nm to about 300 nm, although lesser and greater thicknesses can also be employed.

A sacrificial gate cap layer 14 can be formed over each of the sacrificial regions 12. The sacrificial gate cap layer 14 has a top surface 15. The sacrificial gate cap layer 14 can be manufactured of silicon nitride (SiN), deposited using, for example, low pressure chemical vapor deposition (LPCVD). In other example embodiments, the sacrificial gate cap layer 14 can include, but is not limited to, hafnium oxide ($HfO_2$) or tantalum nitride (TaN) or silicon nitride (SiN). In some embodiments, the sacrificial gate cap layer 14 can include multiple layers, for example, silicon nitride on top of silicon oxide. The sacrificial gate cap layer 14 can be formed utilizing a conventional deposition process including, for example, CVD and PECVD. The sacrificial gate cap layer 14 can have a thickness from about 10 nm to about 200 nm, although lesser and greater thicknesses can also be employed.

Spacers 20 can be formed adjacent the sacrificial regions 12. The spacers 20 can be multi-layer spacers. In one example, the spacers 20 can be formed from three layers, and, thus, be referred to as trilayer spacers 20. The first layer 22 can be, e.g., a silicon boron carbon nitride (SiBCN) layer. The second layer 24 can be, e.g., a germanium dioxide ($GeO_2$) layer. The second layer 24 can be referred to as a sacrificial layer. The third layer 26 can be, e.g., a SiBCN layer. Of course, one skilled in the art can contemplate employing other materials to form the layers 22, 24, 26.

For example, the first and third layers 22, 26 can be, e.g., a nitride film (i.e., nitride layer). In an embodiment, the first and third layers 22, 26 can be an oxide, for example, silicon oxide (SiO), a nitride, for example, a silicon nitride (SiN), or an oxynitride, for example, silicon oxynitride (SiON). In an embodiment, the first and third layers 22, 26 can be, e.g., silicon oxycarbonitride (SiOCN), SiBCN, or similar film types. In some exemplary embodiments, the first and third layers 22, 26 can include a material that is resistant to some etching processes such as, for example, hydrogen fluoride (HF) chemical etching or chemical oxide removal etching.

In one or more embodiments, the spacers 20 can have a total thickness in the range of about 6 nm. In one instance, the first layer 22 can have a thickness of about 2 nm, the second layer 24 can have a thickness of about 2 nm, and the third layer 26 can have a thickness of about 2 nm.

The spacers 20 can be formed by selective etching techniques after formation of the three layers 22, 24, 26. The etching results in recesses or gaps or openings 16 formed between the spacers 20. The etching also results in exposing a top surface 11 of the fin 10. The etching can include a dry etching process such as, for example, reactive ion etching (RIE), plasma etching, ion etching or laser ablation. The etching can further include a wet chemical etching process in which one or more chemical etchants are employed to remove portions of the blanket layers that are not protected by the patterned photoresist. The patterned photoresist can be removed utilizing an ashing process. In one example embodiment, an RIE etch can be employed to create the trilayer or multilayer spacers 20.

Figures 2, 3:
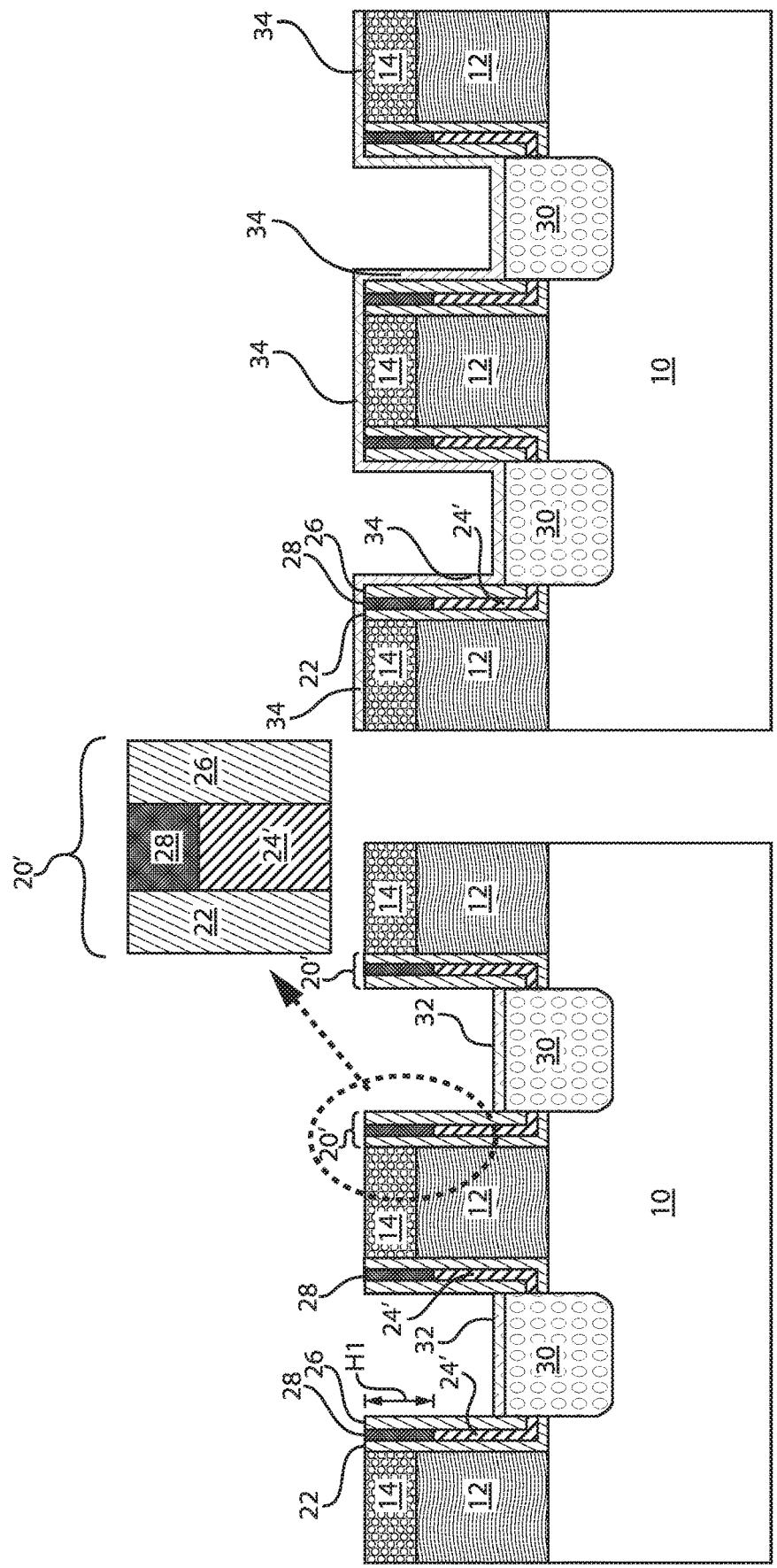
FIG. 2 is a cross-sectional view of the semiconductor structure of FIG. 1 where source/drain regions are formed between the sacrificial layers, in accordance with an embodiment of the present invention.
FIG. 3 is a cross-sectional view of the semiconductor structure of FIG. 2 where a dielectric liner is deposited, in accordance with an embodiment of the present invention.

FIG. 2 is a cross-sectional view of the semiconductor structure of FIG. 1 where source/drain regions are formed between the sacrificial layers, in accordance with an embodiment of the present invention.

In various exemplary embodiments, a dielectric cap 28 can be formed over the second layer 24' of the trilayer spacer 20. The dielectric cap 28 can extend a height H1 over the second layer 24'. The dielectric cap 28 can be, e.g., a nitride cap. The nitride cap 28 can be, e.g., a germanium oxynitride (GeON) cap. The spacer can now be designated as trilayer spacer 20'.

In various exemplary embodiments, source/drain regions 30 are formed between the spacers 20'. The source/drain regions 30 can extend into the fin 10. The source/drain regions 30 directly contact a portion of the spacers 20'. In particular, the source/drain regions 30 directly contact all three layers 22, 24', 26 of the trilayer spacer 20'. The source/drain regions 30 do not contact the nitride cap 28. The source/drain regions 30 can be epitaxially grown on the fin 10.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Moreover, a dielectric liner 32 can be formed over the source/drain regions 30 when the dielectric cap 28 is formed by nitridation process. The dielectric liner 32 directly contacts a top surface of the source/drain regions 30. The dielectric liner 32 directly contacts only one layer of each of the trilayer spacers 20'.

FIG. 3 is a cross-sectional view of the semiconductor structure of FIG. 2 where a dielectric liner is deposited, in accordance with an embodiment of the present invention.

In various exemplary embodiments, a dielectric liner 34 is conformably deposited over the sacrificial gate cap layer 14, adjacent sidewalls of the spacers 20', and the dielectric liner 32. Therefore, the total thickness of dielectric liner 34 is a little thicker on the source/drain regions 30 than other regions.

The dielectric liner 34 can include an oxide, nitride or oxynitride material layer. In one example, when the dielectric liner 34 includes an oxide, the dielectric liner 34 can include silicon oxide ($SiO_2$). In another example, when the dielectric liner 34 includes a nitride, the dielectric liner 34 can include silicon nitride (SiN). In some embodiments, the dielectric liner 34 can include a low-k dielectric material (e.g., SiON, SiOCN, SiOC, SiBCN). In another example, the dielectric liner 34 includes more than one layer of materials, for example, an oxide layer on fin sidewalls followed by nitride layer on oxide layer. The dielectric liner 34 can be formed by thermal oxidation, plasma oxidation, ozone oxidation, thermal nitridation, plasma nitridation, chemical vapor deposition (CVD), plasma enhanced chemical vapor deposition (PECVD), physical vapor deposition (PVD), high-density plasma CVD. In one example embodiment, the dielectric liner 34 can have a thickness of about 2 nm to about 20 nm, or about 5 nm to about 10 nm. In some embodiments, the liner is optional.

In various exemplary embodiments, a height of the dielectric liner 34 can be reduced by chemical-mechanical polishing (CMP) and/or etching. Therefore, the planarization process can be provided by CMP. Other planarization processes can include grinding and polishing.

Figure 4:
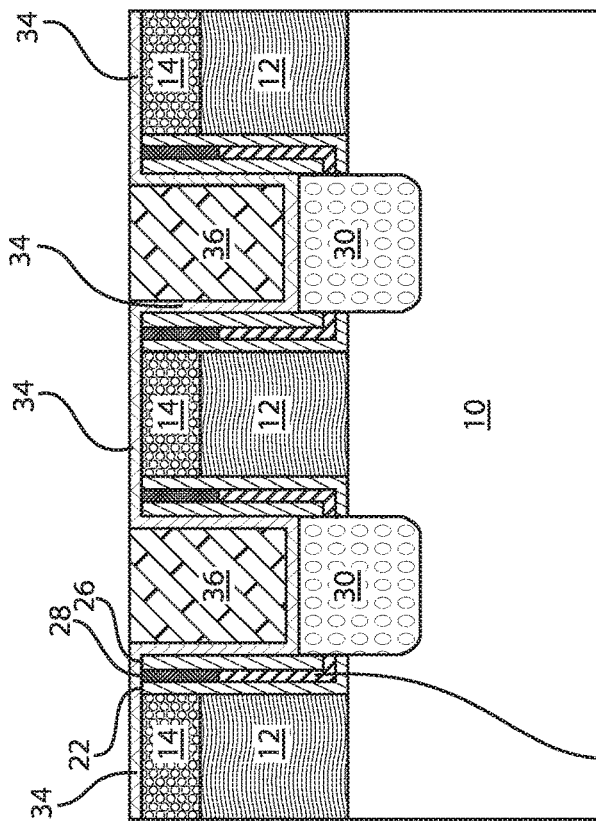
FIG. 4 is a cross-sectional view of the semiconductor structure of FIG. 3 where an inter-layer dielectric (ILD) is deposited over the source/drain regions, in accordance with an embodiment of the present invention.

FIG. 4 is a cross-sectional view of the semiconductor structure of FIG. 3 where an inter-layer dielectric (ILD) is deposited over the source/drain regions, in accordance with an embodiment of the present invention.

In various exemplary embodiments, an oxide gap fill takes place. The ILD oxide 36 can be planarized. The ILD oxide 36 fills the gap or recess or opening between the spacers 20'. The ILD oxide 36 extends to a top surface of the dielectric liner 34. In other words, the ILD oxide 36 can be flush with the dielectric liner 34. The ILD oxide 36 directly contacts the inner surfaces of the dielectric liner 34.

In various embodiments, the height of the ILD oxide fill 36 can be reduced by chemical-mechanical polishing (CMP) and/or etching. Therefore, the planarization process can be provided by CMP. Other planarization process can include grinding and polishing.

In one or more embodiments, the ILD oxide 36 can have a thickness in the range of about 10 nm to about 100 nm, or in the range of about 10 nm to about 50 nm.

The ILD 36 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™ other carbon containing materials, organo-inorganic materials such as spin-on glasses and silsesquioxane-based materials, and diamond-like carbon (DLC), also known as amorphous hydrogenated carbon, α-C:H). Additional choices for the ILD 36 include any of the aforementioned materials in porous form, or in a form that changes during processing to or from being porous and/or permeable to being non-porous and/or non-permeable.

FIG. 5 is a cross-sectional view of the semiconductor structure of FIG. 4 where the sacrificial layers are removed and replaced with a gate structure and a self-aligned contact cap, in accordance with an embodiment of the present invention.

In various exemplary embodiments, the sacrificial gate structure 12 is replaced with a functional gate structure 38. The functional gate structure 38 is, e.g., a metal gate or replacement metal gate (RMG). The sacrificial gate cap layer 14 can also be removed with the sacrificial gate structure 12. A self-aligned contact cap 40 can be formed over the functional gate structure 38. The self-aligned contact cap 40 can prevent an electrical short between gate and source/drain contact. The self-aligned contact cap 40 can include any dielectric material including, for example, $SiO_2$, SiN, SiON, SiOCN or SiBCN. The self-aligned contact cap 40 can be formed by a conventional deposition process such as, for example, CVD, PVD or ALD. Portions of the self-aligned contact cap 40 that are located above the topmost surface can be removed by employing a planarization process, such as, for example, CMP or by selective RIE.

Moreover, the replacement of the sacrificial gate structure 12 and the sacrificial gate cap layer 14 with the functional gate structure 38 and the self-aligned contact cap 40 results in the recessing of the top portion of the trilayer spacer 20'. In particular, the GeON cap 28 can be recessed to a height H2.

Figure 6:
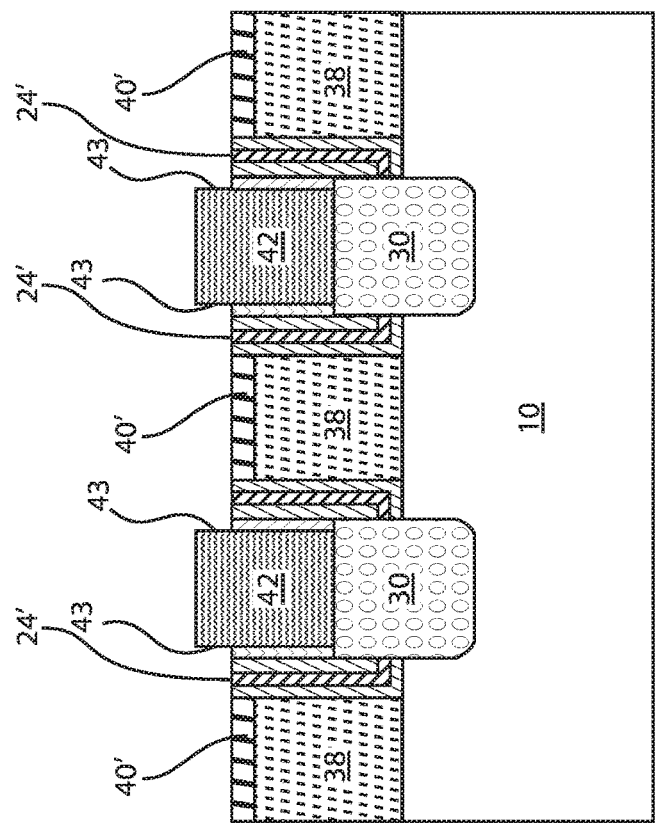
FIG. 6 is a cross-sectional view of the semiconductor structure of FIG. 5 where the ILD is removed and replaced with a conducting material, in accordance with an embodiment of the present invention.

FIG. 6 is a cross-sectional view of the semiconductor structure of FIG. 5 where the ILD is removed and replaced with a conducting material, in accordance with an embodiment of the present invention.

In various exemplary embodiments, the ILD oxide 36 is removed and replaced with a conducting material 42. The conducting material 42 can be referred to as a metal fill. The metal fill 42 can be, e.g., tungsten (W) or cobalt (Co) with silicide metal liner such as titanium (Ti) and titanium nitride (TiN). The top surface 41 of the metal fill 42 can be flush with the top surface of the self-aligned contact cap 40. The metal fill 42 directly contacts the top surface of the source/drain regions 30.

Figure 7:
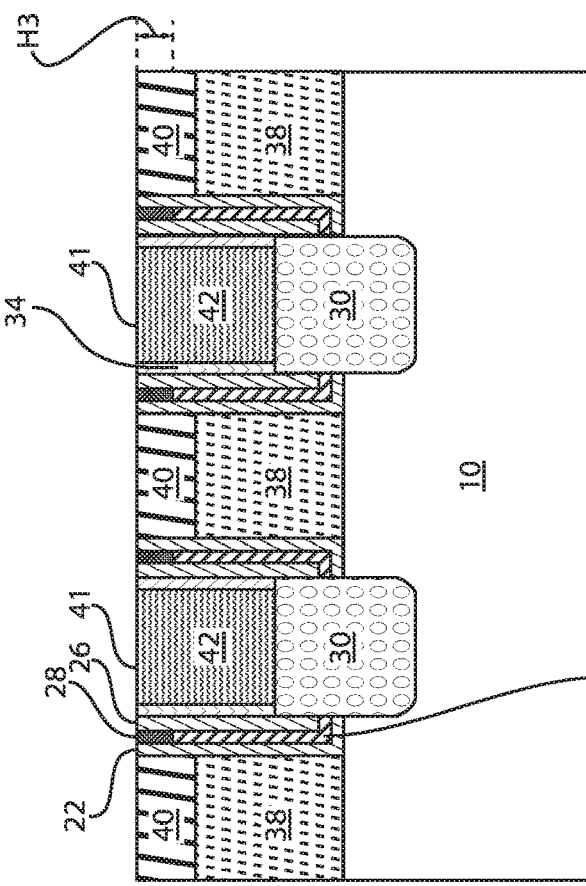
FIG. 7 is a cross-sectional view of the semiconductor structure of FIG. 6 where the self-aligned contact cap is partially removed and a portion of the triple-layer spacers are recessed, in accordance with an embodiment of the present invention.

FIG. 7 is a cross-sectional view of the semiconductor structure of FIG. 6 where the self-aligned contact cap is partially removed and a portion of the triple-layer spacers are recessed, in accordance with an embodiment of the present invention.

In various exemplary embodiments, the self-aligned contact cap 40 is partially removed or recessed to form remaining self-aligned contact cap 40'. The partial removal of the self-aligned contact cap 40 results in the removal of the GeON cap 28 that was formed over the second layer 24' of the trilayer spacer 20'. Therefore, a top surface of layers 22, 24', 26 are now exposed. Additionally, a top portion of sidewalls 43 of metal fill 42 are also exposed. The recess can be designated by a height H3. The height H3 can be selected such that the GeON cap 28 is completely removed at this manufacturing stage and such that the $GeO_2$ sacrificial layer 24' is exposed.

Figure 8:
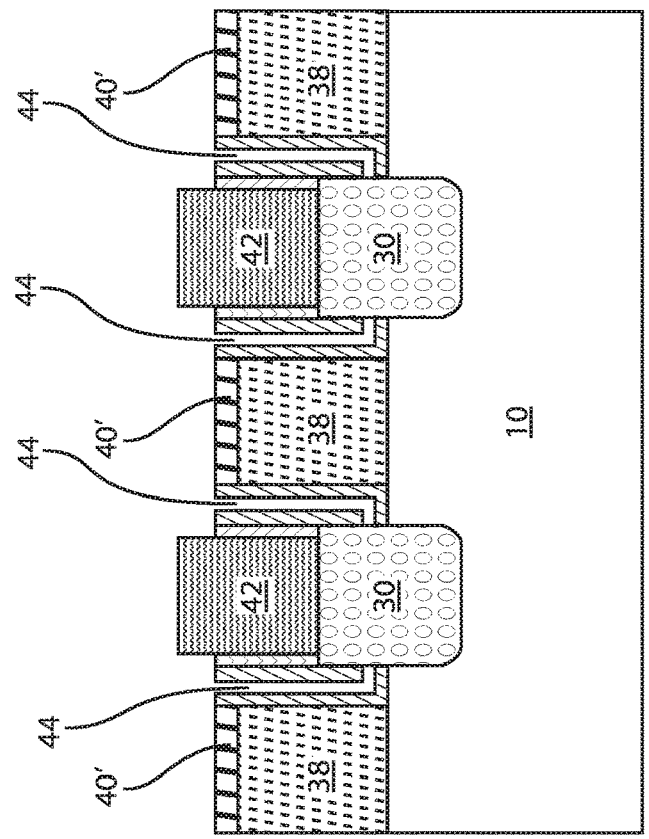
FIG. 8 is a cross-sectional view of the semiconductor structure of FIG. 7 where a sacrificial layer of the triple-layer spacers is removed to form an air-gap spacer, in accordance with an embodiment of the present invention.

FIG. 8 is a cross-sectional view of the semiconductor structure of FIG. 7 where a sacrificial layer of the triple-layer spacers is removed to form an air-gap spacer, in accordance with an embodiment of the present invention.

In various exemplary embodiments, the $GeO_2$ layer 24' is removed or etched in its entirety. The etching can occur by, e.g., deionized water (DIW). The removal of the $GeO_2$ layer 24' does not affect the first and third layers 22, 26 of the spacers 20'. The removal of the $GeO_2$ layer 24' results in an air-gap 44 being formed between the first and third layers 22, 26 of the spacers 20'. The air-gaps 44 extend a length of the gate structure 38. The air-gaps 44 extend to a sidewall of the source/drain regions 30. The air-gaps 44 can have a substantially L-shaped configuration. The air-gaps 44 can be defined by the inner surfaces of the first and third layers 22, 26 of the spacers 20'. After formation of the air-gaps 44, the gate structures 38 continue to contact a SiBCN layer of the spacers 20'. It is noted that the gate structures 38 are encapsulated or formed directly between the SiBCN layers of the spacers 20'. The air-gaps 44 can have a width of about 2 nm. The formation of the air-gaps 44 also does not cause any damage to the gate stacks 38. Further, the formation of the partial air-gap spacers 44 by using a $GeO_2$ sacrificial layer 24' (middle layer of spacer 20') resolves the WFM/HK exposure to plasma during self-aligned contact cap and SiN spacer removal. Also, formation of the air-gap spacers 44 reduces the parasitic capacitance between the gate structures 38 and the source/drain regions 30. Thus, the air-gap spacers 44 can be formed in replacement metal gate schemes, which can be incorporated into different types of semiconductor devices, such as, but not limited to, fin field-effect-transistors (FinFETs), gate-all-around devices, and planar FETs.

Figure 9:
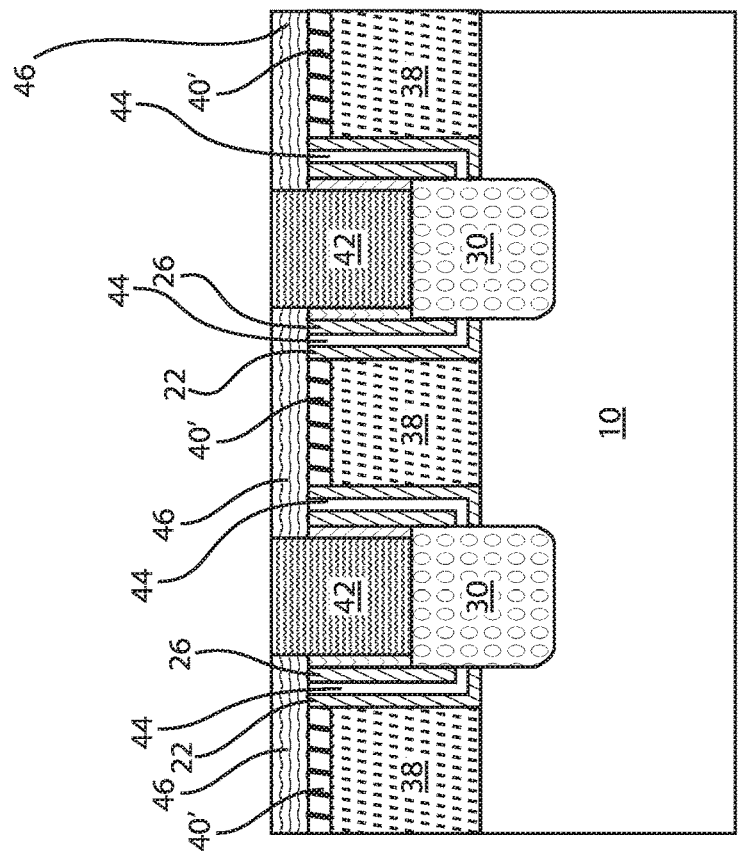
FIG. 9 is a cross-sectional view of the semiconductor structure of FIG. 8 where a self-aligned contact cap is formed over the gate structures and the air-gap spacers, in accordance with an embodiment of the present invention.

FIG. 9 is a cross-sectional view of the semiconductor structure of FIG. 8 where a second self-aligned contact cap is formed over the gate structures and the air-gap spacers, in accordance with an embodiment of the present invention.

In various exemplary embodiments, the second self-aligned contact cap 46 can be deposited over the structure to close off one end of the air-gaps 44. Additionally, self-aligned contact 46 contacts a top surface of the remaining first self-aligned contact caps 40' formed over the gate structures 38. The second self-aligned contact cap 46 also contacts sidewalls 43 of the metal fill 42. The second self-aligned contact cap 46 can be formed, e.g., by pinch-off dielectrics deposition and CMP. The pinch-off deposition approach allows for the second self-aligned contact cap 46 to pinch off at the upper end of the air-gaps 44. The pinch-off dielectrics can include, e.g., plasma CVD of SiN, SiCN, SiCOH, carbon doped silicon oxide (pSiCOH), or high density plasma (HDP) $SiN/SiO_2$ in the formation of the air spacers/air gaps 44. Therefore, air-gap formation can be achieved by employing dielectric deposition (by pinch-off of the dielectric layer).

The selection of these dielectric materials and processes has an impact in the voids (gaps 44) dimension and volume. The overall void dimension and type of dielectric material are related to the total device capacitance reduction and reliability. Significant capacitance reduction with good reliability can be achieved on current 7 nm device structures through material, process, and structural/architectural optimization with the pinch-off deposition process approach described herein.

Figure 10:
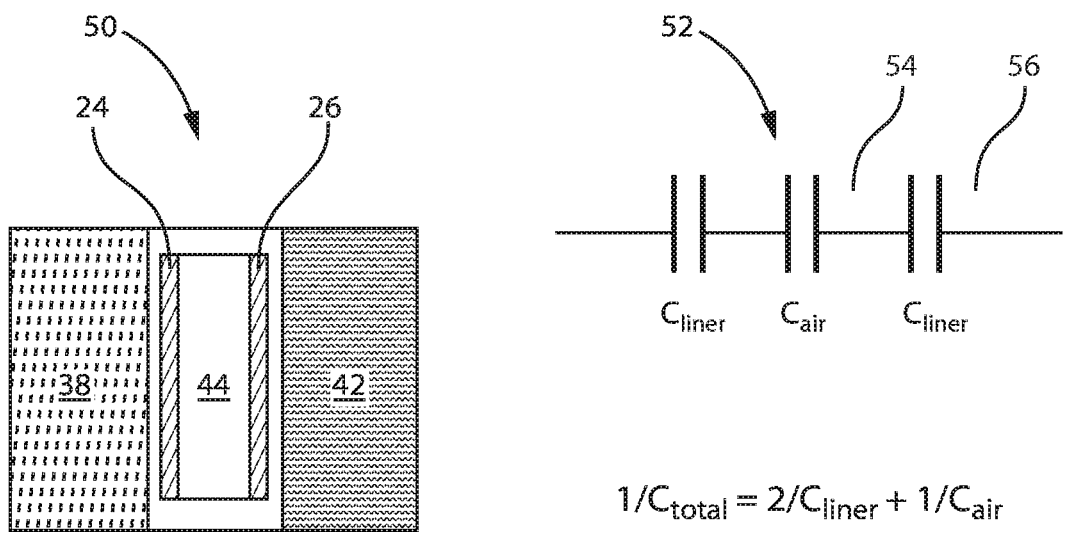
FIG. 10 is a diagram of an equivalent capacitance model, in accordance with an embodiment of the present invention.

FIG. 10 is a diagram of an equivalent capacitance model, in accordance with an embodiment of the present invention.

An enlarged cross-sectional view 50 illustrates an air-gap 44 formed between the gate structure 38 and the metal fill 42, the air-gap 44 defined by the first layer 22 and the third layer 26 of the spacer 20'. The equivalent capacitance model 52 shows the air spacer capacitor 54 in series with the linear capacitors 56. The total capacitance is dominated by the air-spacer. The air-spacer capacitor 54 allows for a significant reduction in parasitic capacitance between the gate structure 38 and the metal fill 42 (as well as the source/drain region 30).

Figure 11:
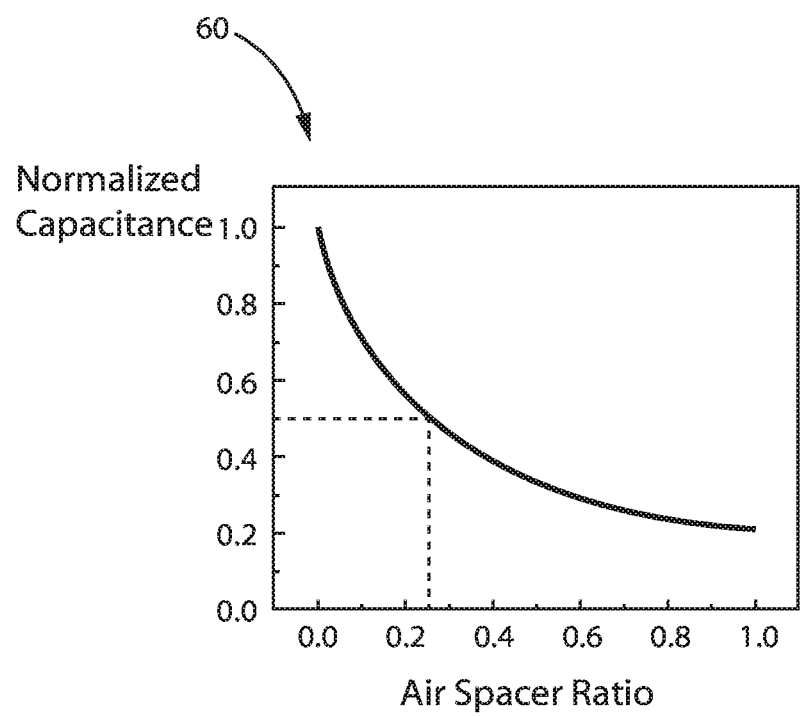
FIG. 11 is a diagram illustrating reduction of parasitic capacitance due to the formation of partial air-gap spacers within a semiconductor structure, in accordance with an embodiment of the present invention.

FIG. 11 is a diagram 60 illustrating reduction of parasitic capacitance due to the formation of partial air-gap spacers within a semiconductor structure, in accordance with an embodiment of the present invention.

Diagram 60 illustrates that the higher the air spacer ratio, the lower the normalized capacitance. Thus, even a small portion of air between the gate structure 38 and the metal fill 42 can cause a significant capacitance reduction. In one instance, a 50% capacitance reduction can be achieved with a 25% air spacer ratio, as shown in FIG. 11.

In conclusion, continued integrated circuit scaling deeper into the nanoscale regime has provided improved performance through shrinking of the Front-End-of-Line (FEOL) device and Back-End-of-Line (BEOL) interconnect. With scaling, resistance-capacitance (RC) delay is an increasing challenge, limiting overall product performance. Capacitance reduction is therefore important for device performance in both the FEOL and BEOL device structure. Conventional capacitance reduction methods for FEOL and BEOL while maintaining yield and reliability have needed significant material innovations such lower-k cap and bulk dielectrics with desired mechanical, structural, electrical and other properties. To further improve capacitance, other innovations in device structure and process integration are needed, such as air gaps and air spacers described in accordance with the exemplary embodiments of the present invention. The air spacer and air gap structures described herein employ pinch-off deposition to optimize the capacitance reduction while maintaining yield and reliability.

Figure 12:
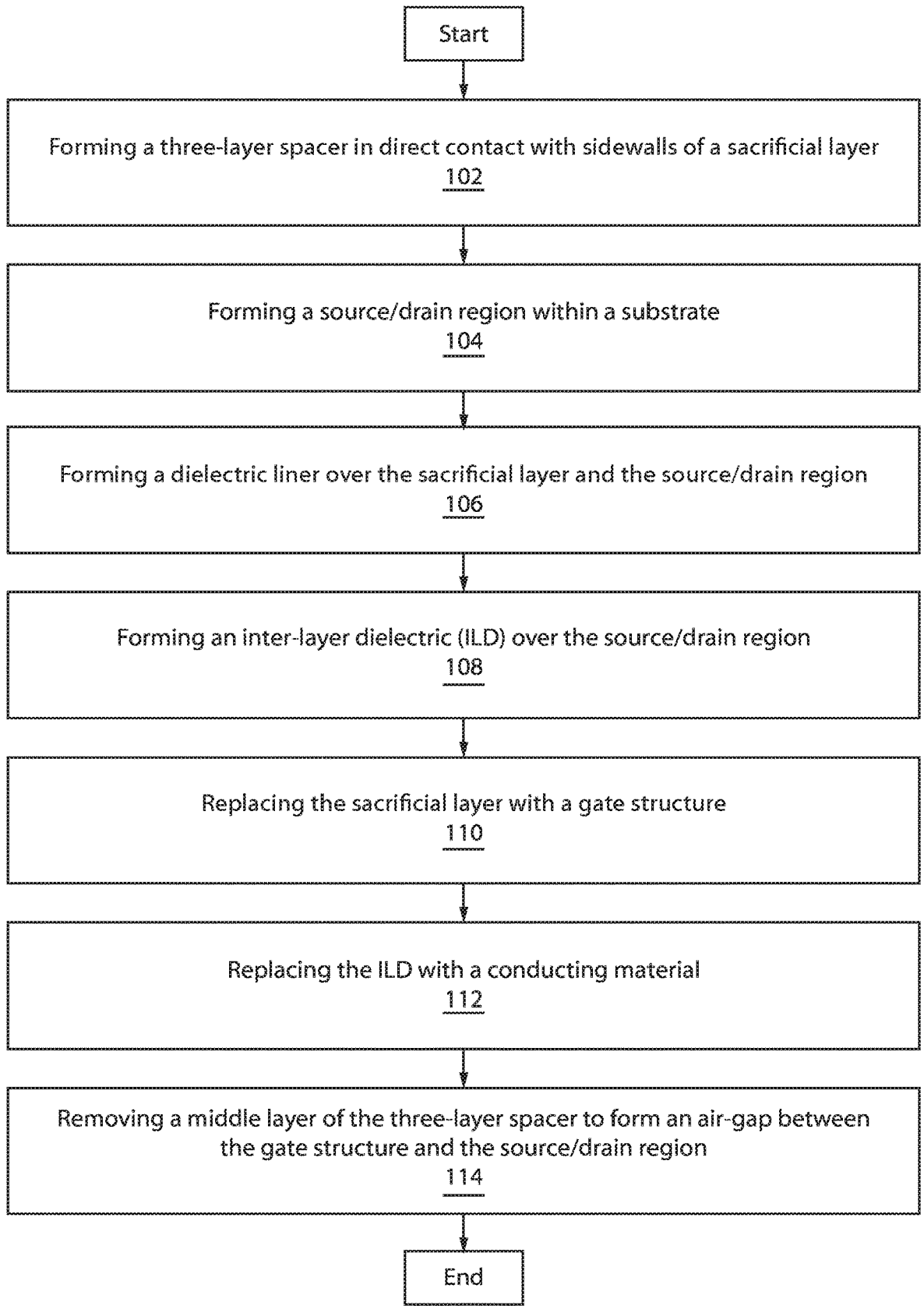
FIG. 12 is a block/flow diagram of an exemplary method of forming a partial air-gap spacer, in accordance with an embodiment of the present invention.

FIG. 12 is a block/flow diagram of an exemplary method of forming a partial air-gap spacer, in accordance with an embodiment of the present invention.

At block 102, a three-layer spacer is formed in direct contact with sidewalls a sacrificial layer. The first layer can be, e.g., a SiBCN layer, the second layer can be, e.g., a $GeO_2$ sacrificial layer, and the third layer can be, e.g., another SiBCN layer. The trilayer spacer can have a thickness or width of about 6 nm. The spacers can be deposited by an ALD process.

At block 104, a source/drain region is formed within a substrate.

At block 106, a dielectric liner is formed over the sacrificial layer and the source/drain region. The dielectric liner directly contacts a top surface of the source/drain regions. The dielectric liner directly contacts only one layer of each of the trilayer spacers.

At block 108, an inter-layer dielectric (ILD) is formed over the source/drain region. The ILD oxide fills the gap or recess or opening between the spacers. The ILD oxide extends to a top surface of the dielectric liner.

At block 110, the sacrificial layer is replaced with a gate structure. The functional gate structure, which remains in the structure of the final device controls device switching, i.e., the electrical state of a device, e.g., FinFET, from "ON" to "OFF."

At block 112, the ILD is replaced with a conducting material. The conducting material can be a metal fill. The metal fill can be, e.g., W or Co.

At block 114, a middle layer of the three-layer spacer is removed to form an air-gap between the gate structure and the source/drain region. The air-gap results in reduction of parasitic capacitance between the gate structures and the source/drain regions. In some embodiments, the 2 nm air-gaps can produce more than 50% capacitance reduction as the total capacitance is dominated by the air-gaps.

It will be helpful in appreciating the effects of the invention in the following discussion to recall that selectivity of etching is generally a function of a difference in etch rates of different materials for a given etchant chemistry. Therefore, factors that tend to slow the etching of the selectively etched material tends to reduce effective selectivity to other materials and that best selectivity will be observed when the etch progresses as rapidly as possible.

Regarding FIGS. 1-8, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for reducing parasitic capacitance between gate structures and source/drain regions by forming air-gaps or air-gap spacers therebetween (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for reducing parasitic capacitance, the method comprising:
    forming a three-layer spacer in direct contact with sidewalls of a sacrificial layer;
    forming a source/drain region within a substrate;
    forming a dielectric liner over the sacrificial layer and the source/drain region;
    forming an inter-layer dielectric (ILD) over the source/drain region;
    replacing the sacrificial layer with a gate structure;
    replacing the ILD with a conducting material directly contacting a top surface of the source/drain region and directly contacting sidewalls of the three-layer spacer; and
    removing a middle layer of the three-layer spacer to form air-gaps between the gate structure and the source/drain region.

2. The method of claim 1, wherein the first and third layers of the three-layer spacer are silicon boron carbon nitride (SiBCN) layers, and the middle layer of the three-layer spacer is a germanium dioxide ($GeO_2$) layer.

3. The method of claim 2, wherein the $GeO_2$ layer is nitrized to form a germanium oxynitride (GeON) cap thereon.

4. The method of claim 3, wherein the three-layer spacer has a total thickness of about 6 nm.

5. The method of claim 4, further comprising forming a self-aligned contact cap over the gate structure before replacing the ILD with the conducting material.

6. The method of claim 5, further comprising partially recessing the self-aligned contact cap after replacing the ILD with the conducting material.

7. The method of claim 6, wherein the recessing of the self-aligned contact cap results in removal of the GeON cap formed over the $GeO_2$ layer before forming the air-gaps.

8. The method of claim 1, wherein each of the air-gaps extends a length of the gate structure.

9. The method of claim 1, wherein each of the air-gaps extends to a sidewall of the source/drain region.

10. A method for reducing parasitic capacitance, the method comprising:
    forming multi-layer spacers between source/drain regions;
    forming a dielectric liner over the multi-layer spacers and the source/drain regions;
    forming gate structures adjacent the multi-layer spacers;
    depositing a conducting material in direct contact with the source/drain regions and in direct contact with sidewalls of the multi-layer spacers;

forming a self-aligned contact cap over the gate structures; and removing a sacrificial layer of each of the multi-layer spacers to form air-gaps between the gate structures and the source/drain regions, the air-gaps having a substantially L-shaped configuration.

11. The method of claim 10, wherein the sacrificial layer of the multi-layer spacers is a germanium dioxide ($GeO_2$) layer.

12. The method of claim 11, wherein the $GeO_2$ layer is nitrized to form a germanium oxynitride (GeON) cap thereon.

13. The method of claim 12, wherein the self-aligned contact cap is partially recessed to remove the GeON cap formed over the $GeO_2$ layer before forming the air-gaps.

14. The method of claim 10, wherein each of the air-gaps extends a length of the gate structures.

15. The method of claim 10, wherein each of the air-gaps extends to a sidewall of the source/drain regions.

* * * * *